US009698012B2

(12) United States Patent
Zhang et al.

(10) Patent No.: US 9,698,012 B2
(45) Date of Patent: Jul. 4, 2017

(54) METHOD AND APPARATUS FOR MANUFACTURING LOW TEMPERATURE POLY-SILICON FILM, AND LOW TEMPERATURE POLY-SILICON FILM

(71) Applicant: SHENZHEN CHINA STAR OPTOELECTRONICS TECHNOLOGY CO., LTD., Shenzhen (CN)

(72) Inventors: Longxian Zhang, Shenzhen (CN); Wei Yu, Shenzhen (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 143 days.

(21) Appl. No.: 14/395,915

(22) PCT Filed: Aug. 26, 2014

(86) PCT No.: PCT/CN2014/085163
§ 371 (c)(1),
(2) Date: Oct. 21, 2014

(87) PCT Pub. No.: WO2016/023246
PCT Pub. Date: Feb. 18, 2016

(65) Prior Publication Data
US 2016/0049300 A1    Feb. 18, 2016

(30) Foreign Application Priority Data
Aug. 15, 2014    (CN) .......................... 2014 1 0405175

(51) Int. Cl.
*H01L 21/02* (2006.01)
*B23K 26/00* (2014.01)
(Continued)

(52) U.S. Cl.
CPC .... *H01L 21/02686* (2013.01); *B23K 26/0081* (2013.01); *B23K 26/354* (2015.10);
(Continued)

(58) Field of Classification Search
CPC ......... H01L 21/02686; H01L 21/02595; H01L 29/04; H01L 21/02678; H01L 27/1285;
(Continued)

(56) References Cited

U.S. PATENT DOCUMENTS

| 2008/0087895 | A1* | 4/2008 | Han ................... B23K 26/0613 257/72 |
| 2011/0181798 | A1* | 7/2011 | Yasuda .................... B41J 2/451 349/4 |
| 2012/0164345 | A1* | 6/2012 | Lee ...................... G02B 5/3083 427/542 |

* cited by examiner

*Primary Examiner* — David Vu
*Assistant Examiner* — Mouloucoulaye Inoussa
(74) *Attorney, Agent, or Firm* — Andrew C. Cheng

(57) ABSTRACT

Disclosed are a method and an apparatus for manufacturing low temperature poly-silicon film, and a low temperature poly-silicon film. The method includes: providing a substrate; forming an amorphous silicon film; applying different temperatures to different regions of the amorphous silicon film by using an excimer laser annealing method, to change the amorphous silicon film into a molten state; and recrystallizating the amorphous silicon film in the molten state, a region having a lower temperature serving as a starting point, a region having a higher temperature serving as an end point, to form a low temperature poly-silicon film. The low temperature poly-silicon film manufactured by the above method and apparatus has a greater size of the crystalline grain and a larger electronic mobility than in the existing technology.

7 Claims, 8 Drawing Sheets

(51) Int. Cl.
 *B23K 26/354* (2014.01)
 *B23K 103/16* (2006.01)
 *B23K 103/00* (2006.01)
(52) U.S. Cl.
 CPC .. *H01L 21/02422* (2013.01); *H01L 21/02488* (2013.01); *H01L 21/02532* (2013.01); *H01L 21/02678* (2013.01); *B23K 2203/166* (2015.10); *B23K 2203/56* (2015.10)
(58) Field of Classification Search
 CPC ........ H01L 21/02691; H01L 21/02683; B23K 26/0081; B23K 26/354; B23K 26/0613; G02B 5/201; G02B 5/22; G02B 5/3083; G02B 27/26; G02F 1/133516; B41J 2/451
 USPC ....... 257/66, 72; 438/487, 795, 166; 372/25; 427/542, 558; 349/4
 See application file for complete search history.

METHOD AND APPARATUS FOR MANUFACTURING LOW TEMPERATURE POLY-SILICON FILM, AND LOW TEMPERATURE POLY-SILICON FILM

CROSS-REFERENCE TO RELATED APPLICATIONS

This application claims the priority benefit of Chinese Patent Application No. 201410405175.0, filed on Aug. 15, 2014, the content of which is incorporated by reference herein in its entirety for all purposes.

FIELD OF THE TECHNOLOGY

The present disclosure relates to liquid crystal display technology field, and specifically, to a method for manufacturing a low temperature poly-silicon (LTPS) film, an apparatus for manufacturing a LTPS film, and a LTPS film.

BACKGROUND

Liquid crystal display (LCD) is a popular electronic apparatus, and the LCD has many advantages, such as, low power consumption, a small size, and light in weight. Thus, the LCD is welcomed by users. In existing technology, thin film transistor (TFT) LCD is a main kind of LCD. With a development of flat panel display technology, a request that the LCD having a high resolution and a lower power consumption is put forward. Amorphous silicon has a low electronic mobility. The LTPS can be manufactured in a lower temperature than the amorphous silicon, and the LTPS has a higher electronic mobility than the amorphous silicon. Furthermore, a complementary metal oxide semiconductor (CMOS) component made by the LTPS can be applied on the LCD, and the LCD using the CMOS component made by the LTPS has a high resolution and low power consumption. Thus, the LTPS is widely used and researched.

Currently, methods for manufacturing a LTPS film include a solid phase crystallization (SPC) method, a metal induced crystallization (MIC) method, and an excimer laser annealing (ELA) method, and etc. The ELA method is a most popular method in manufacturing a LTPS film. Manufacturing the LTPS film by using the ELA method is described in detail as follows. An amorphous silicon film is shined by an excimer laser beam, and melted by a high temperature generated by the excimer laser beam, and a LTPS film is formed by a recrystallization of the melted amorphous silicon film.

A size of a crystalline grain of the LTPS film has an important effect on an electrical property of the LTPS film. For example, the size of the crystalline grain has an important effect on the electrical property of the LTPS film. When the size of the crystalline grain is large, the LTPS film has a high electronic mobility. When the size of the crystalline grain is small, the LTPS film has a low electronic mobility. In the ELA method, an amorphous silicon film is shined by the excimer laser beam, and melted by a high temperature generated by the excimer laser beam, and the LTPS film is formed by a recrystallization of the melted amorphous silicon film. When the LTPS film is formed by a recrystallization of the melted amorphous silicon film, a direction of the recrystallization is from a low energy to a high energy, a low temperature to a high temperature. In the ELA method in the existing technology, the excimer laser beam uniformly shines on the amorphous silicon film, thus the temperature of each part of the amorphous silicon film is roughly equal. Thus, a starting point and a direction of recrystallization are disorder and irregular, which may cause a small size of the crystalline grain of the LTPS film, and more crystalline grain boundaries of the LTPS film. The electronic mobility of the LTPS film is low.

SUMMARY OF THE INVENTION

A method for manufacturing low temperature poly-silicon film, and an apparatus for manufacturing low temperature poly-silicon film are provided in present disclosure. The method and the apparatus can improve the electronic mobility of the low temperature poly-silicon film. A low temperature poly-silicon film is also provided in present disclosure. The low temperature poly-silicon film has a larger electronic mobility.

In a first aspect, a method for manufacturing low temperature poly-silicon film is provided. The method for manufacturing low temperature poly-silicon film includes the following steps.

Providing a substrate;

forming an amorphous silicon film;

applying different temperatures to different regions of the amorphous silicon film by using an excimer laser annealing method, to change the amorphous silicon film into a molten state; and recrystallizating the amorphous silicon film in the molten state, a region having a lower temperature serving as a starting point, a region having a higher temperature serving as an end point, to form a low temperature poly-silicon film.

In a first embodiment of the first aspect, wherein the step of "applying different temperatures to different regions of the amorphous silicon film by using an excimer laser annealing method, to change the amorphous silicon film into a molten state" comprises:

irradiating different regions of the amorphous silicon film with laser beams having different energy in order to apply different temperatures to different regions of the amorphous silicon film, to change the amorphous silicon film into a molten state.

In a second embodiment of the first aspect, wherein the step of "applying different temperatures to different regions of the amorphous silicon film by using an excimer laser annealing method, to change the amorphous silicon film into a molten state" comprises:

the amorphous silicon film comprises a plurality of first regions and a plurality of second regions arranged at intervals, each first region is applied with a first temperature and each second region is applied with a second temperature, to change the amorphous silicon film into a molten state.

Combined with the second embodiment of the first aspect, in a third embodiment of the first aspect, wherein the first temperature is higher than the second temperature, when the amorphous silicon film in a molten state recrystallizes, and a direction of recrystallization begins from each second region to each first region.

Combined with the second embodiment of the first aspect, in a fourth embodiment of the first aspect, wherein the step of "the amorphous silicon film comprises a plurality of first regions and a plurality of second regions arranged at intervals, each first region is applied with a first temperature and each second region is applied with a second temperature, to change the amorphous silicon film into a molten state" comprises:

providing a laser apparatus, the laser apparatus being configured to generate laser beams;

providing a first polarizing apparatus and generating a first polarized light when the laser beams passing through the first polarizing apparatus;

providing a photo mask, wherein the photo mask comprises a plurality of first light transmission regions and a plurality of second light transmission regions arranged at intervals, arranging a second polarizing apparatus on each second transmission region, generating a second polarized light when the first polarized light is passed though the second polarizing apparatus, wherein a polarization direction of the second polarized light is different from a polarization direction of the first polarized light, applying the first temperature on each first region when the first polarized light irradiates the first region through the first light transmission region, and applying the second temperature on each second region when the second polarized light irradiates the second region through the second light transmission region.

Combined with the fourth embodiment of the first aspect, in a fifth embodiment of the first aspect, wherein an included angle between the polarization direction of the second polarized light and the polarization direction of the first polarized light is greater than zero degree and less than ninety degree.

Combined with the fourth embodiment of the first aspect, in a sixth embodiment of the first aspect, wherein the first polarizing apparatus is a polarizer and the second polarizing apparatus is a polarizer.

In a seventh embodiment of the first aspect, wherein between the step of "forming an amorphous silicon film" and the step of "applying different temperatures to different regions of the amorphous silicon film by using an excimer laser annealing method, to change the amorphous silicon film into a molten state", the method for manufacturing low temperature poly-silicon film further comprises:

eliminating hydrogen of the amorphous silicon film.

In a eighth embodiment of the first aspect, wherein between the step of "providing a substrate" and the step of "forming an amorphous silicon film", the method for manufacturing low temperature poly-silicon film further comprises:

forming a buffer layer on a surface of the substrate;

the step of "forming an amorphous silicon film" is:

forming the an amorphous silicon film on the buffer layer.

In a second aspect, an apparatus for manufacturing low temperature poly-silicon film is provided. The apparatus for manufacturing low temperature poly-silicon film, comprising:

a laser apparatus configured to generate laser beams;

a first polarizing apparatus configured to generate a first polarized light when the laser beams passing through the first polarizing apparatus;

a photo mask comprising a plurality of first light transmission regions and a plurality of second light transmission regions arranged at intervals, a second polarizing apparatus being arranged on each second transmission region, and a second polarized light being generated when the first polarized light passing through the second polarizing apparatus, a polarization direction of the second polarized light being different from a polarization direction of the first polarized light, the second polarized light and the first polarized light being configured to change the amorphous silicon film into a molten state, and apply different temperatures on different regions of the amorphous silicon film.

In a first embodiment of the second aspect, wherein an included angle between the polarization direction of the second polarized light and the polarization direction of the first polarized light is greater than zero degree and less than ninety degree.

In a second embodiment of the second aspect, wherein the first polarizing apparatus is a polarizer and the second polarizing apparatus is a polarizer.

In a third embodiment of the second aspect, wherein the second polarizing apparatus is arranged on a surface of the second light transmission region and the surface of the second light transmission region is away from the laser apparatus.

In a third aspect, a low temperature poly-silicon film is provided, wherein the low temperature poly-silicon film is formed by a process of changing an amorphous silicon film into a molten state, and recrystallizating, the amorphous silicon film comprises a plurality of first regions and a plurality of second regions arranged at intervals, when the amorphous silicon film in a molten state recrystallizes, a direction of recrystallization begins from each second region to each first region.

In a first embodiment of the third aspect, wherein a size of the crystalline grain of the low temperature poly-silicon film is greater than 0.8 um.

In a second embodiment of the third aspect, wherein an electronic mobility of the low temperature poly-silicon film is greater than 150 cm$^2$/(V*S).

In a third embodiment of the third aspect, a temperature of the second region is lower than a temperature of the first region.

Combined with the existing technology, the embodiment in present disclosure, the different regions of the amorphous silicon film are applied with different temperatures by using the excimer laser annealing method. Thus, when the amorphous silicon film in the molten state crystallizes, the region having a lower temperature serves as the starting point, and the direction of recrystallization begins from the region having lower temperature to the region having higher temperature. By this means, when manufacturing the LTPS film, the starting point and the direction of the recrystallization can be under control, the size of the crystalline grain of the LTPS film is improved and the crystalline grain boundary is reduced. Science, the size of the crystalline grain of the LTPS film is improved, and the LTPS film has a larger electronic mobility than in the existing technology.

BRIEF DESCRIPTION OF THE DRAWINGS

In order to illustrate the embodiments or existing technical solutions more clearly, a brief description of drawings that assists the description of embodiments of the invention or existing art will be provided below. It would be apparent that the drawings in the following description are only for some of the embodiments of the invention. A person having ordinary skills in the art will be able to obtain other drawings on the basis of these drawings without paying any creative work.

DETAILED DESCRIPTION OF ILLUSTRATED EMBODIMENTS

Technical solutions in embodiments of the present invention will be illustrated clearly and entirely with the aid of the drawings in the embodiments of the invention. It is apparent that the illustrated embodiments are only some embodiments of the invention instead of all of them. Other embodiments that a person having ordinary skills in the art obtains based on the illustrated embodiments of the invention without paying any creative work should all be within the protection scope sought by the present invention.

Figure 1:
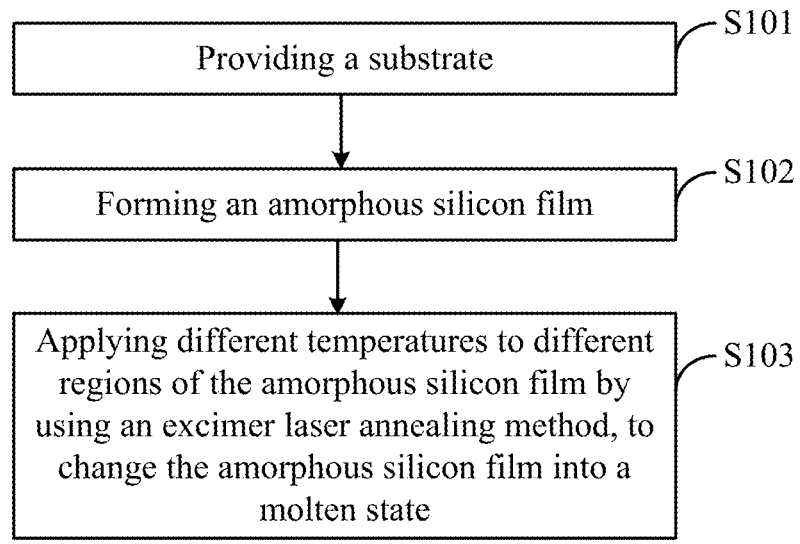
FIG. 1 is a flowchart of a method for manufacturing a low temperature poly-silicon film according to a first embodiment of present disclosure.

Referring to FIG. 1, FIG. 1 is a flowchart of a method for manufacturing a low temperature poly-silicon (LTPS) film according to a first embodiment of present disclosure. The method for manufacturing a LTPS film includes the following steps.

Figure 2:
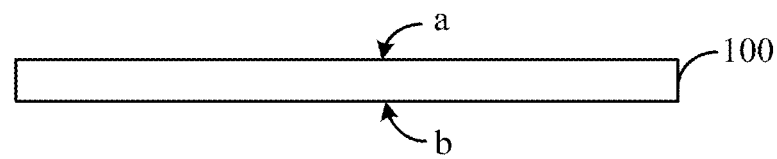
FIG. 2 to FIG. 5 and FIG. 7 are schematic diagrams of section views corresponding to each step of the method for manufacturing low temperature poly-silicon film according to a first embodiment of present disclosure.

Step 101, providing a substrate 100. Referring to FIG. 2, the substrate 100 can be a glass substrate in the embodiment. The substrate 100 includes a first surface "a" and a second surface "b" opposite to the first surface "a". It is illustrated that in other embodiment, the substrate 100 is not limited to a glass substrate.

Figure 3:
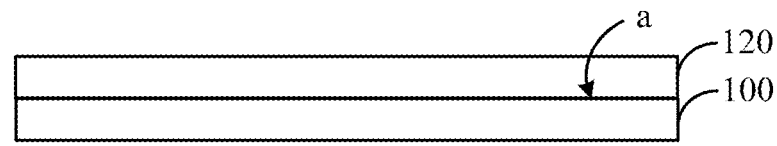

Step 102, forming an amorphous silicon film 120. Referring to FIG. 3, the amorphous silicon film 120 is formed on the first surface "a". It is illustrated that in other embodiment, the amorphous silicon film 120 can be formed on the second surface "b" of the substrate 100.

Step S103, applying different temperatures to different regions of the amorphous silicon film 120 by using an excimer laser annealing method, to change the amorphous silicon film 120 into a molten state. Different regions of the amorphous silicon film 120 are applied with different temperatures by using an excimer laser annealing method, when the amorphous silicon film 120 is changed into the molten state, different regions of the amorphous silicon film 120 have different temperatures. A temperature of a region which is applied by a higher temperature and changed into a molten state of the amorphous silicon film 120 is higher than a temperature of a region which is applied by a lower temperature and changed into a molten state of the amorphous silicon film 120.

In an embodiment, the step S103 "applying different temperatures to different regions of the amorphous silicon film 120 by using an excimer laser annealing method, to change the amorphous silicon film 120 into a molten state" detailed includes the following step. Irradiating different regions of the amorphous silicon film 120 with laser beams having different energy in order to apply different temperatures to different regions of the amorphous silicon film 120, to change the amorphous silicon film 120 into a molten state.

Figure 4:
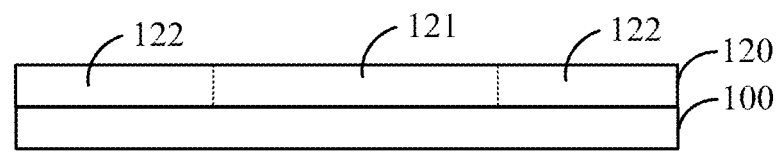
Figure 5:
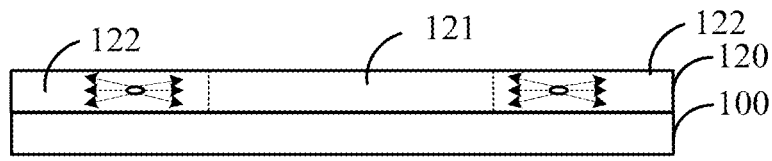

Referring to FIG. 4, the step S103 "applying different temperatures to different regions of the amorphous silicon film 120 by using an excimer laser annealing method, to change the amorphous silicon film 120 into a molten state" is described in detail as follows. The amorphous silicon film 120 includes a plurality of first regions 121 and a plurality of second regions 122 arranged at intervals; each first region is applied with a first temperature and each second region is applied with a second temperature, to change the amorphous silicon film 120 into a molten state. In the embodiment, the first temperature is higher than the second temperature. Thus, when the amorphous silicon film 120 in a molten state recrystallizes, a direction of recrystallization begins from each second region 122 to each first region 121. When the amorphous silicon film 120 in a molten state recrystallizes, a direction of the recrystallization is from a low energy to a high energy, a low temperature to a high temperature. Thus, as shown in FIG. 5, when the amorphous silicon film 120 in a molten state recrystallizes, each second region 122 serves as a starting point of recystallization, each first region 121 serves as an end point of recystallization, and the direction of the recrystallization is from each second region 122 to each first region 121. It is illustrated that in other embodiment, the first temperature is lower than the second temperature. In the condication, when the amorphous silicon film 120 in a molten state recrystallizes, each first region 121 serves as a starting point of recrystallization, each second region 122 serves as an end point of recrystallization, and the direction of the re recrystallization is from each first region 121 to each second region 122. In the embodiment, a number of the first region 121 is one, and a number of the second region 122 is two. It is illustrated the number of the first region 121 is not limited to one, and the number of the second region 122 is not limited to two.

Figure 6:
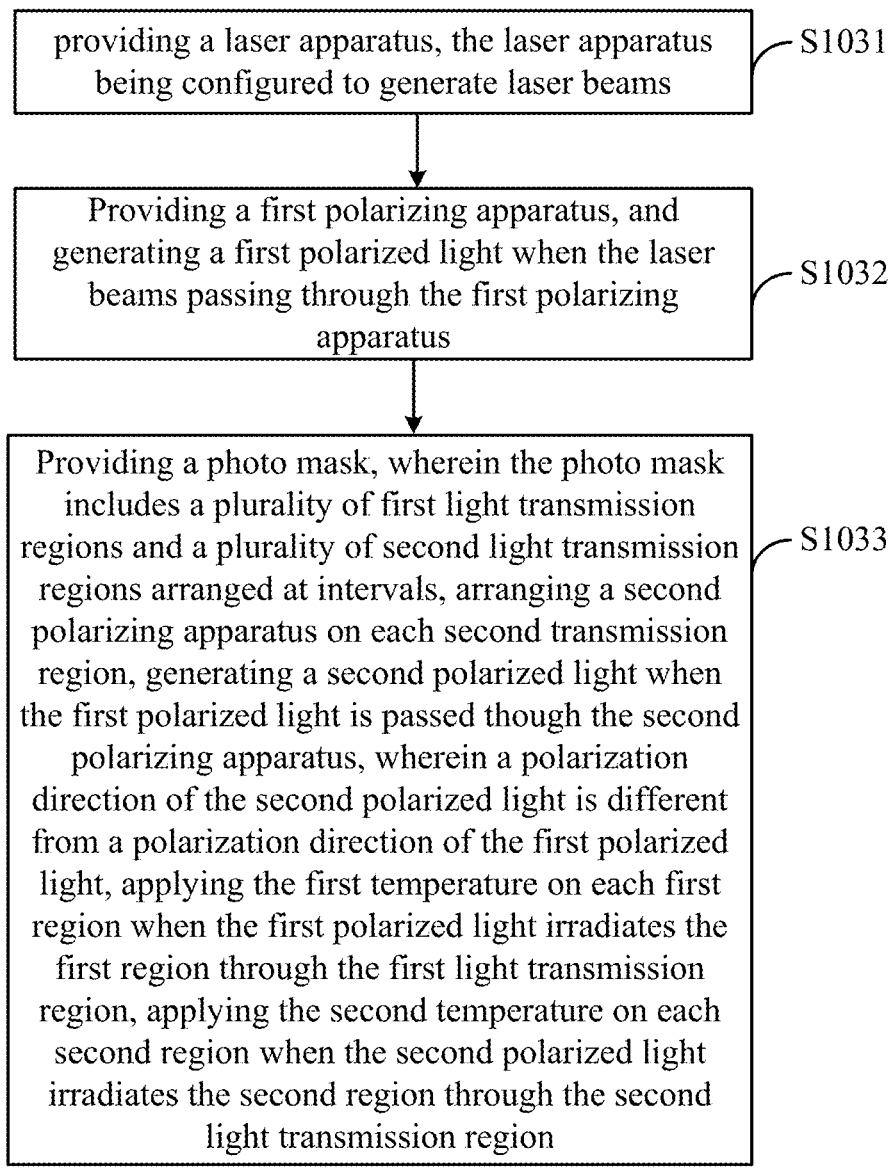
FIG. 6 is a detailed flowchart of changing an amorphous silicon film into a molten state according to an embodiment of present disclosure.
Figure 7:
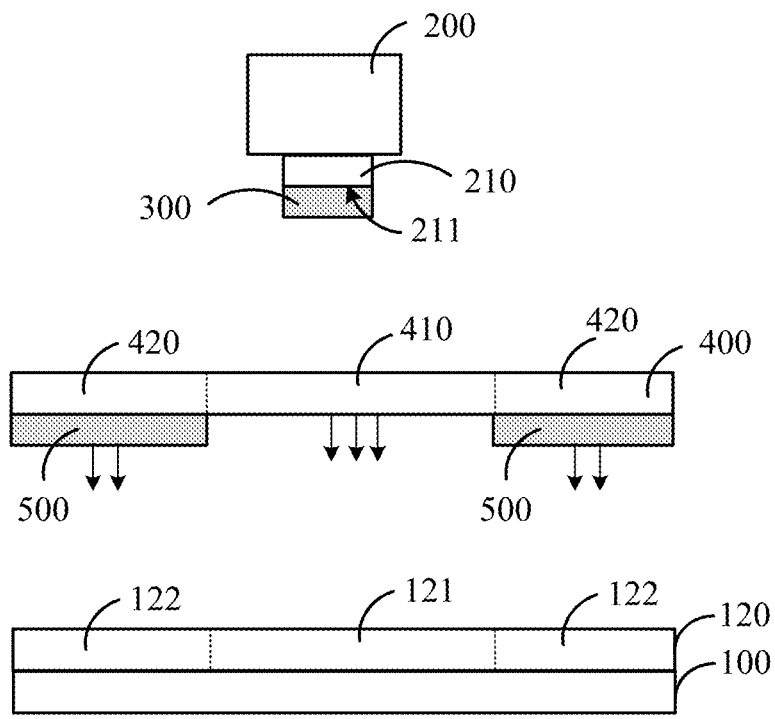

Referring to FIG. 6 and FIG. 7, FIG. 6 is a detailed flowchart of the step of "the amorphous silicon film 120 includes a plurality of a first regions and a plurality of a second regions arranged at intervals; each first region is applied with a first temperature and each second region is applied with a second temperature, to change the amorphous silicon film 120 into a molten state". The detailed flowchart of the step is described as follows.

Step S1031, providing a laser apparatus 200, the laser apparatus 200 being configured to generate laser beams. In detail, the laser apparatus 200 includes a laser head 210, the laser beams generated by the laser apparatus 200 are output by the laser head 210. The laser beams have high energy, and the high energy of the laser beams can change the amorphous silicon film 120 into the molten state.

Step S1032, providing a first polarizing apparatus 300, and generating a first polarized light when the laser beams passing through the first polarizing apparatus 300. The laser head 210 has a light outputting surface 211, and preferably, the first polarizing apparatus 300 is arranged on the lighting outputting surface 211 of the laser head 210. The laser beams are output through the light outputting surface 211, and the first polarized light is generated after the laser beams passing through the first polarizing apparatus 300.

Step S1033, providing a photo mask 400, wherein the photo mask 400 includes a plurality of first light transmission regions 410 and a plurality of second light transmission regions 420 arranged at intervals, arranging a second polarizing apparatus 500 on each second transmission region 420, generating a second polarized light when the first polarized light is passed though the second polarizing apparatus 500, wherein a polarization direction of the second polarized light is different from a polarization direction of the first polarized light, applying the first temperature on each first region 121 when the first polarized light irradiates the first region 121 through the first light transmission region 410, applying the second temperature on each second region 122 when the second polarized light irradiates the second region 122 through the second light transmission region 420. In the embodiment, the second polarizing apparatus 500 is arranged on a surface of the second light transmission region 420, and the surface of the second light transmission region 420 is adjacent to the amorphous silicon film 120. In other words, the second polarizing apparatus 500 is arranged on a surface of the second light transmission region 420, and the surface of the second light transmission region 420 is away from the laser apparatus 200.

In the embodiment, the first polarizing apparatus 300 is a polarizer, and the second polarizing apparatus 500 is also a polarizer. The polarizer is made of Iceland spar, a main component of the Iceland spar is CaCO3, thus, the polarizer is able to tolerate high temperature (such as, more than 1000° C.) and can not be burned out by the laser apparatus 200. An included angle between the polarization direction of the second polarized light and the polarization direction of the first polarized light is greater than zero degree and less than ninety degree. The greater the included angle between the polarization direction of the second polarized light and the polarization direction of the first polarized light is, the weaker the light intensity of the second polarized light is. Thus, when the second polarized light irradiates the second region 122 through the second light transmission region 420, the second temperature applied on the second region 122 is much lower than the first temperature applied on the first region 121. In other words, the second temperature is lower than the first temperature, and a difference value between the first temperature and the second temperature is larger. By this means, when the amorphous silicon film 120 in the molten state crystallizes, a starting point which is from the second region 122 to the first region 121 is orderly, and a size of the crystalline grain is large.

Compared with the existing technology, the embodiment in present disclosure, the different regions of the amorphous silicon film 120 are applied with different temperatures by using the excimer laser annealing method. Thus, when the amorphous silicon film 120 in the molten state crystallizes, the region having a lower temperature serves as the starting point, and the direction of recrystallization begins from the region having lower temperature to the region having higher temperature. By this means, when manufacturing the LTPS film, the starting point and the direction of the recrystallization can be under control, the size of the crystalline grain of the LTPS film is improved and the crystalline grain boundary is reduced. Science, the size of the crystalline grain of the LTPS film is improved, and the LTPS film has a larger electronic mobility than in the existing technology.

Figure 8:
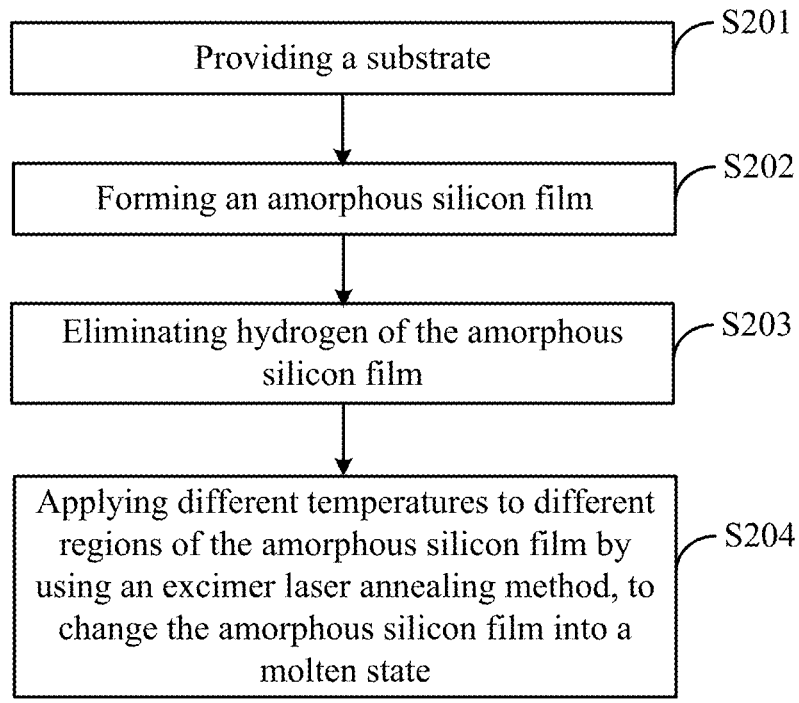
FIG. 8 is a flowchart of a method for manufacturing a low temperature poly-silicon film according to a second embodiment of present disclosure.

Referring to FIG. 8, FIG. 8 is a flowchart of a method for manufacturing a low temperature poly-silicon film according to a second embodiment of present disclosure. The method for manufacturing a LTPS film in the second embodiment is similar with the method for manufacturing a LTPS film in the first embodiment. In the embodiment, the schematic diagrams of section view corresponding to each step of the method in the first embodiment can be referred to.

In the embodiment, the method for manufacturing a LTPS film includes the following steps.

Step S201, providing a substrate 100. Referring to FIG. 2, the substrate 100 can be a glass substrate in the embodiment. The substrate 100 includes a first surface "a" and a second surface "b" opposite to the first surface "a". It is illustrated that in other embodiment, the substrate 100 is not limited to a glass substrate.

Step S202, forming an amorphous silicon film 120. Referring to FIG. 3, the amorphous silicon film 120 is formed on the first surface "a". It is illustrated that in other embodiment, the amorphous silicon film 120 can be formed on the second surface "b" of the substrate 100.

Step S203, eliminating hydrogen of the amorphous silicon film 120. The amorphous silicon film 120 is processed in high temperature to eliminate hydrogen of the amorphous silicon film 120 and guarantee a low content (such as, less than 1%) of the hydrogen in the amorphous silicon film 120. In case of the amorphous silicon film 120 is cracked caused by a subsequent step, because high energy generated by the laser in the ELA method may cause a sudden boiling of the hydrogen in the subsequent step.

Step S204, applying different temperatures to different regions of the amorphous silicon film 120 by using an excimer laser annealing method, to change the amorphous silicon film 120 into a molten state. Different regions of the amorphous silicon film 120 are applied with different temperatures by using an excimer laser annealing method, when the amorphous silicon film 120 is changed into the molten state, different regions of the amorphous silicon film 120 have different temperatures. A temperature of a region which is applied by a higher temperature and changed into a molten state of the amorphous silicon film 120 is higher than a temperature of a region which is applied by a lower temperature and changed into a molten state of the amorphous silicon film 120.

In an embodiment, the step S204 "applying different temperatures to different regions of the amorphous silicon film 120 by using an excimer laser annealing method, to change the amorphous silicon film 120 into a molten state" detailed includes the following step. Irradiating different regions of the amorphous silicon film 120 with laser beams having different energy in order to apply different temperatures to different regions of the amorphous silicon film 120, to change the amorphous silicon film 120 into a molten state.

Referring to FIG. 4, the step S204 "applying different temperatures to different regions of the amorphous silicon film 120 by using an excimer laser annealing method, to change the amorphous silicon film 120 into a molten state" is described in detail as follows. The amorphous silicon film 120 includes a plurality of first regions 121 and a plurality of second regions 122 arranged at intervals; each first region is applied with a first temperature and each second region is applied with a second temperature, to change the amorphous silicon film 120 into a molten state. In the embodiment, the first temperature is higher than the second temperature. Thus, when the amorphous silicon film 120 in a molten state recrystallizes, a direction of recrystallization begins from each second region 122 to each first region 121. When the amorphous silicon film 120 in a molten state recrystallizes, a direction of the recrystallization is from a low energy to a high energy, a low temperature to a high temperature. Thus, as shown in FIG. 5, when the amorphous silicon film 120 in a molten state recrystallizes, each second region 122 serves as a starting point of recrystallization, each first region 121 serves as an end point of recrystallization, and the direction of the recrystallization is from each second region 122 to each first region 121. It is illustrated that in other embodiment, the first temperature is lower than the second temperature. In the condication, when the amorphous silicon film 120 in a molten state recystallizes, each first region 121 serves as a starting point of recystallization, each second region 122 serves as an end point of recystallization, and the direction of the re recystallization is from each first region 121 to each second region 122. In the embodiment, a number of the first region 121 is one, and a number of the second region 122 is two. It is illustrated the number of the first region is not limited to one, and the number of the second region is not limited to two.

Referring to FIG. 6 and FIG. 7, FIG. 6 is a detailed flowchart of the step of "the amorphous silicon film 120 includes a plurality of a first regions and a plurality of a second regions arranged at intervals; each first region is applied with a first temperature and each second region is applied with a second temperature, to change the amorphous silicon film 120 into a molten state". The detailed flowchart of the step is described as follows.

Step S1031, providing a laser apparatus 200, the laser apparatus 200 being configured to generate laser beams. In detail, the laser apparatus 200 includes a laser head 210, the laser beams generated by the laser apparatus 200 are output by the laser head 210. The laser beams have high energy, and the high energy of the laser beams can change the amorphous silicon film 120 into the molten state.

Step S1032, providing a first polarizing apparatus 300, and generating a first polarized light when the laser beams passing through the first polarizing apparatus 300. The laser head 210 has a light outputting surface 211, and preferably, the first polarizing apparatus 300 is arranged on the lighting outputting surface 211 of the laser head 210. The laser beams are output through the light outputting surface 211, and the first polarized light is generated after the laser beams passing through the first polarizing apparatus 300.

Step S1033, providing a photo mask 400, wherein the photo mask 400 includes a plurality of first light transmission regions 410 and a plurality of second light transmission regions 420 arranged at intervals, arranging a second polarizing apparatus 500 on each second transmission region 420, generating a second polarized light when the first polarized light is passed though the second polarizing apparatus 500, wherein a polarization direction of the second polarized light is different from a polarization direction of the first polarized light, applying the first temperature on each first region 121 when the first polarized light irradiates the first region 121 through the first light transmission region 410, applying the second temperature on each second region 122 when the second polarized light irradiates the second region 122 through the second light transmission region 420. In the embodiment, the second polarizing apparatus 500 is arranged on a surface of the second light transmission region 420, and the surface of the second light transmission region 420 is adjacent to the amorphous silicon film 120. In other words, the second polarizing apparatus 500 is on a surface of the second light transmission region 420, and the surface of the second light transmission region 420 is away from the laser apparatus 200.

In the embodiment, the first polarizing apparatus 300 is a polarizer, and the second polarizing apparatus 500 is also a polarizer. The polarizer is made of Iceland spar, a main component of the Iceland spar is CaCO3, thus, the polarizer is able to tolerate high temperature (such as, more than 1000° C.) and can not be burned out by the laser apparatus 200. An included angle between the polarization direction of the second polarized light and the polarization direction of the first polarized light is greater than zero degree and less than ninety degree. The greater the included angle between the polarization direction of the second polarized light and the polarization direction of the first polarized light is, the weaker the light intensity of the second polarized light is. Thus, when the second polarized light irradiates the second region 122 through the second light transmission region 420, the second temperature applied on the second region 122 is much lower than the first temperature applied on the first region 121. In other words, the second temperature is lower than the first temperature, and a difference value between the first temperature and the second temperature is larger. By this means, when the amorphous silicon film 120 in the molten state crystallizes, a starting point which is from the second region 122 to the first region 121 is orderly, and a size of the crystalline grain is large. For example, the size of the crystalline grain is greater than 0.8 um.

Compared with the existing technology, the embodiment in present disclosure, the different regions of the amorphous silicon film 120 are applied with different temperatures by using the excimer laser annealing method. Thus, when the amorphous silicon film 120 in the molten state crystallizes, the region having a lower temperature serves as the starting point, and the direction of recrystallization begins from the region having lower temperature to the region having higher temperature. By this means, when manufacturing the LTPS film, the starting point and the direction of the recrystallization can be under control, the size of the crystalline grain of the LTPS film is improved and the crystalline grain boundary is reduced. Science, the size of the crystalline grain of the LTPS film is improved, the LTPS film has a larger electronic mobility than in the existing technology. The electronic mobility of the LTPS film is greater than 150 $cm^2/(V*S)$. Furthermore, the amorphous silicon film is processed in high temperature to eliminate hydrogen of the amorphous silicon film and guarantee a low content (such as, less than 1%) of the hydrogen in the amorphous silicon film in the embodiment. In case of the amorphous silicon film is cracked caused by a subsequent step, because high energy generated by the laser in the ELA method may cause a sudden boiling of the hydrogen in the subsequent step.

Figure 9:
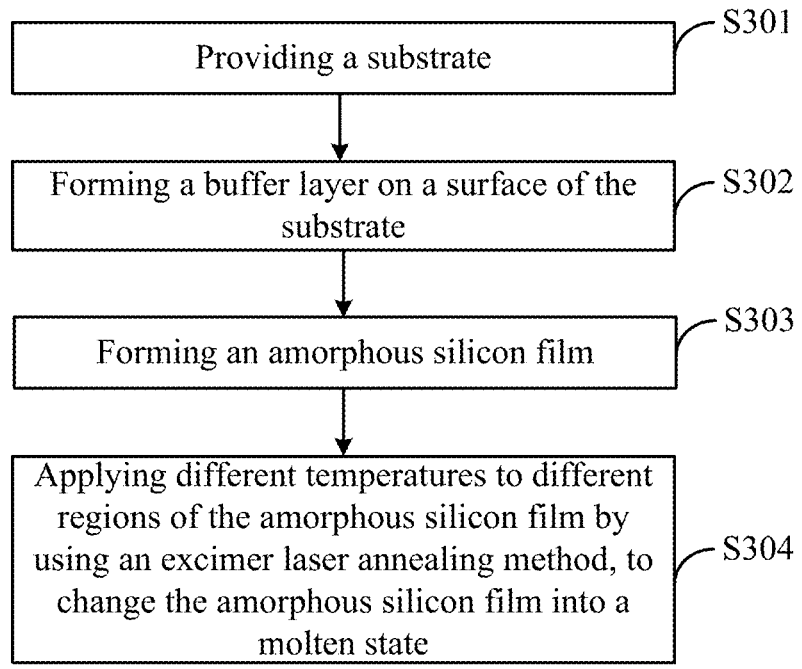
FIG. 9 is a flowchart of a method for manufacturing a low temperature poly-silicon film according to a third embodiment of present disclosure.

Referring to FIG. 9, FIG. 9 is a flowchart of a method for manufacturing a low temperature poly-silicon film according to a third embodiment of present disclosure. The method for manufacturing a LTPS film in the third embodiment is similar with the method for manufacturing a LTPS film in the first embodiment. In the embodiment, the schematic diagrams of section view corresponding to each step of the method in the first embodiment can be referred to.

Figure 10:
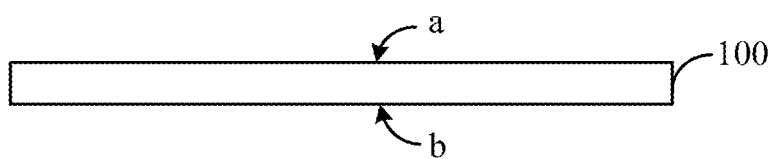
FIG. 10 to FIG. 14 and FIG. 16 are schematic diagrams of section views corresponding to each step of the method for manufacturing low temperature poly-silicon film according to a third embodiment of present disclosure.

Step S301, providing a substrate 100. Referring to FIG. 10, the substrate 100 can be a glass substrate in the embodiment. The substrate 100 includes a first surface "a" and a second surface "b" opposite to the first surface "a". It is illustrated that in other embodiment, the substrate 100 is not limited to a glass substrate.

Figure 11:
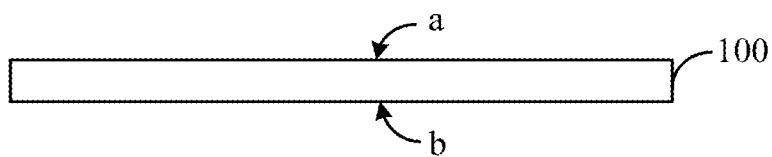

Step S302, forming a buffer layer 110 on a surface of the substrate 100. Referring to FIG. 11, the buffer layer 110 is formed on the first surface "a" in the embodiment. The buffer layer 110 is configured to reduce stress in the processing of manufacturing the LTPS film to avoid a damage of the substrate 100. A material of the buffer layer 110 can be selected from silicon oxide, silicon nitride, silicon oxynitride, and one of a combination of the silicon oxide, the silicon nitride, and the silicon oxynitride.

Figure 12:
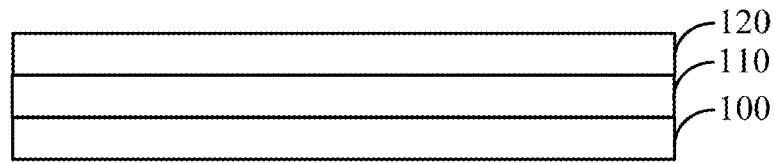

Step S303, forming an amorphous silicon film 120. Referring to FIG. 12, the step S303 includes the following step in detail. Forming the amorphous silicon film 120 on the buffer layer 110.

Step S304, applying different temperatures to different regions of the amorphous silicon film 120 by using an excimer laser annealing method, to change the amorphous silicon film 120 into a molten state. Different regions of the amorphous silicon film 120 are applied by different temperatures by using an excimer laser annealing method, when the amorphous silicon film 120 is changed into the molten state, different regions of the amorphous silicon film 120 have different temperatures. A temperature of a region which is applied by a higher temperature and changed into a molten state of the amorphous silicon film 120 is higher than a temperature of a region which is applied by a lower temperature and changed into a molten state of the amorphous silicon film 120.

In an embodiment, the step S304 "applying different temperatures to different regions of the amorphous silicon film 120 by using an excimer laser annealing method, to change the amorphous silicon film 120 into a molten state" detailed includes the following step. Irradiating different regions of the amorphous silicon film 120 with laser beams having different energy in order to apply different temperatures to different regions of the amorphous silicon film 120, to change the amorphous silicon film 120 into a molten state.

Figure 13:
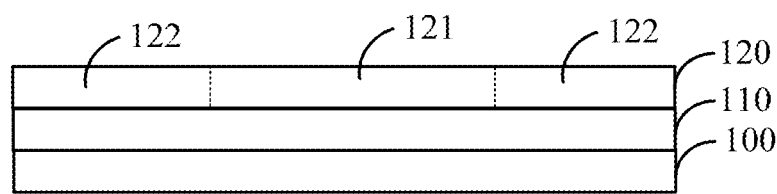
Figure 14:
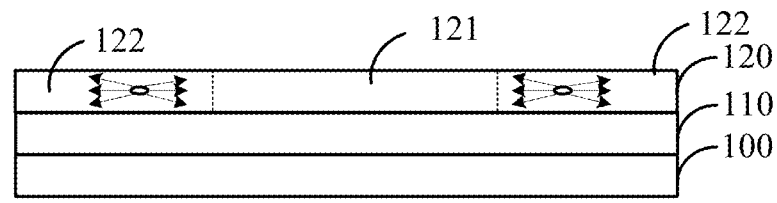

Referring to FIG. 13 the step S304 "applying different temperatures to different regions of the amorphous silicon film 120 by using an excimer laser annealing method, to change the amorphous silicon film 120 into a molten state" is described in detail as follows. The amorphous silicon film 120 includes a plurality of first regions 121 and a plurality of second regions 122 arranged at intervals; each first region is applied with a first temperature and each second region is applied with a second temperature, to change the amorphous silicon film 120 into a molten state. In the embodiment, the first temperature is higher than the second temperature. Thus, when the amorphous silicon film 120 in a molten state recrystallizes, a direction of recrystallization begins from each second region 122 to each first region 121. When the amorphous silicon film 120 in a molten state recrystallizes, a direction of the recrystallization is from a low energy to a high energy, a low temperature to a high temperature. Thus, as shown in FIG. 14, when the amorphous silicon film 120 in a molten state recrystallizes, each second region 122 serves as a starting point of recystallization, each first region 121 serves as an end point of recystallization, and the direction of the recystallization is from each second region 122 to each first region 121. It is illustrated that in other embodiment, the first temperature is lower than the second temperature. In the condication, when the amorphous silicon film 120 in a molten state recrystallizes, each first region 121 serves as a starting point of recystallization, each second region 122 serves as an end point of recystallization, and the direction of the re recystallization is from each first region 121 to each second region 122. In the embodiment, a number of the first region 121 is one, and a number of the second region 122 is two. It is illustrated the number of the first region 121 is not limited to one, and the number of the second region 122 is not limited to two.

Figure 15:
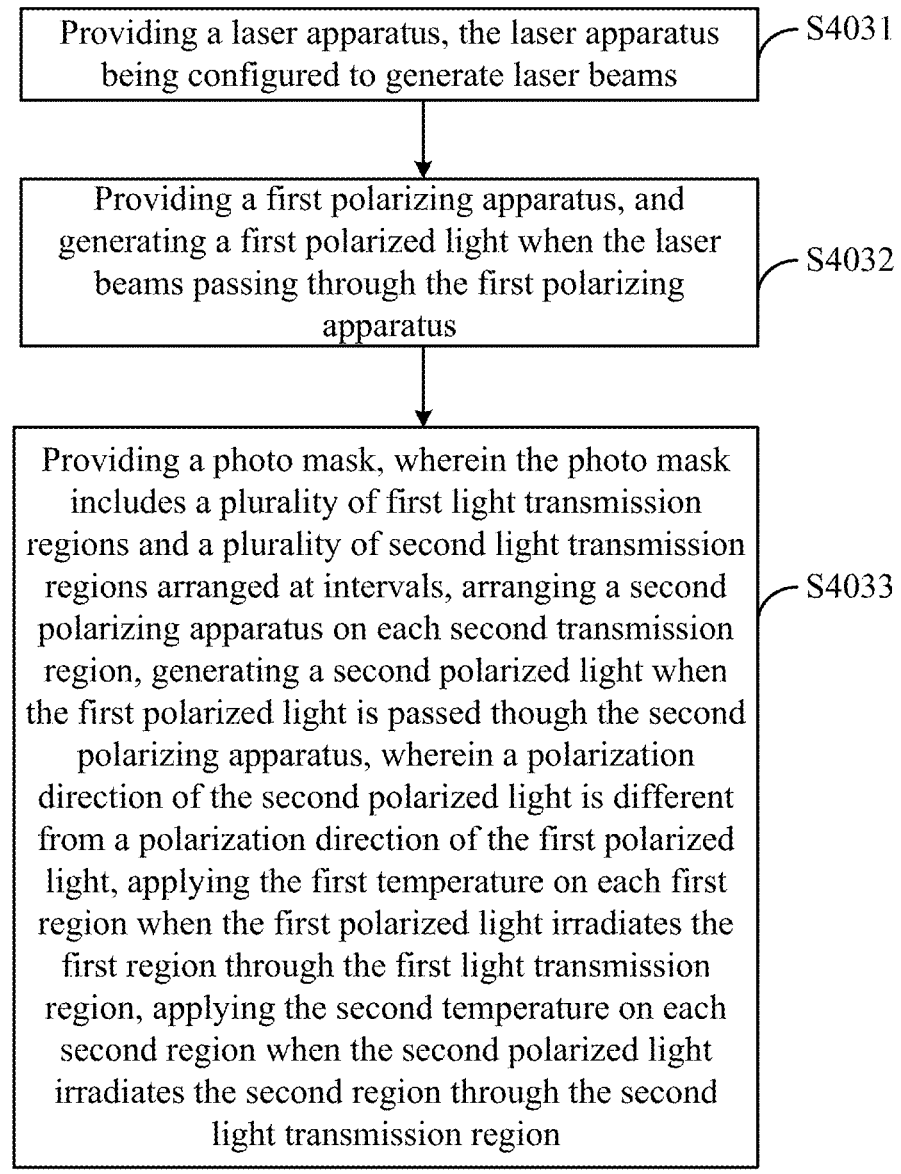
FIG. 15 is a detailed flowchart of changing an amorphous silicon film into a molten state according to another embodiment of present disclosure.
Figure 16:
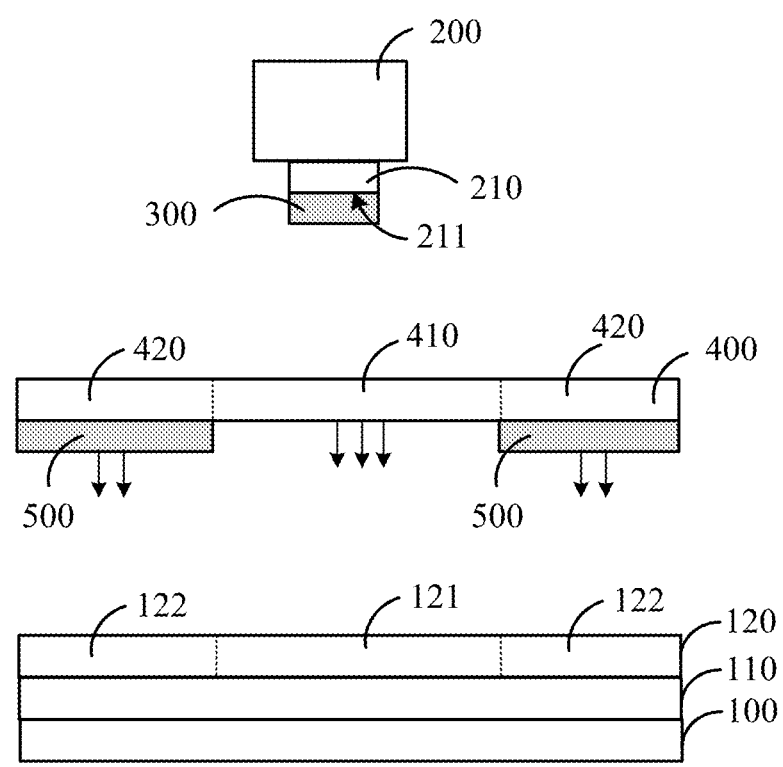

Referring to FIG. 15 and FIG. 16, FIG. 15s a detailed flowchart of the step of "the amorphous silicon film 120 includes a plurality of a first regions and a plurality of a second regions arranged at intervals; each first region is applied with a first temperature and each second region is applied with a second temperature, to change the amorphous silicon film 120 into a molten state". The detailed flowchart of the step is described as follows.

Step S3031, providing a laser apparatus 200, the laser apparatus 200 being configured to generate laser beams. In detail, the laser apparatus 200 includes a laser head 210, the laser beams generated by the laser apparatus 200 are output by the laser head 210. The laser beams have high energy, and the high energy of the laser beams can change the amorphous silicon film 120 into the molten state.

Step S3032, providing a first polarizing apparatus 300, and generating a first polarized light when the laser beams passing through the first polarizing apparatus 300. The laser head 210 has a light outputting surface 211, and preferably, the first polarizing apparatus 300 is arranged on the lighting outputting surface 211 of the laser head 210. The laser beams are output through the light outputting surface 211, and the first polarized light is generated after the laser beams passing through the first polarizing apparatus 300.

Step S3033, providing a photo mask 400, wherein the photo mask 400 includes a plurality of first light transmission regions 410 and a plurality of second light transmission regions 420 arranged at intervals, arranging a second polarizing apparatus 500 on each second transmission region 420, generating a second polarized light when the first polarized light is passed though the second polarizing apparatus 500, wherein a polarization direction of the second polarized light is different from a polarization direction of the first polarized light, applying the first temperature on each first region 121 when the first polarized light irradiates the first region 121 through the first light transmission region 410, applying the second temperature on each second region 122 when the second polarized light irradiates the second region 122 through the second light transmission region 420. In the embodiment, the second polarizing apparatus 500 is arranged on a surface of the second light transmission region 420, and the surface of the second light transmission region 420 is adjacent to the amorphous silicon film 120. In other words, the second polarizing apparatus 500 is arranged on a surface of the second light transmission region 420, and the surface of the second light transmission region 420 is away from the laser apparatus 200.

In the embodiment, the first polarizing apparatus 300 is a polarizer, and the second polarizing apparatus 500 is also a polarizer. The polarizer is made of Iceland spar, a main component of the Iceland spar is $CaCO_3$, thus, the polarizer is able to tolerate high temperature (such as, more than 1000° C.) and can not be burned out by the laser apparatus 200. An included angle between the polarization direction of the second polarized light and the polarization direction of the first polarized light is greater than zero degree and less than ninety degree. The greater the included angle between the polarization direction of the second polarized light and the polarization direction of the first polarized light is, the weaker the light intensity of the second polarized light is. Thus, when the second polarized light irradiates the second region 122 through the second light transmission region 420, the second temperature applied on the second region 122 is much lower than the first temperature applied on the first region 121. In other words, the second temperature is lower than the first temperature, and a difference value between the first temperature and the second temperature is larger. By this means, when the amorphous silicon film 120 in the molten state crystallizes, a starting point which is from the second region 122 to the first region 121 is orderly, and a size of the crystalline grain is large.

Compared with the existing technology, the embodiment in present disclosure, the different regions of the amorphous silicon film 120 are applied with different temperatures by using the excimer laser annealing method. Thus, when the amorphous silicon film 120 in the molten state crystallizes, the region having a lower temperature serves as the starting point, and the direction of recrystallization begins from the region having lower temperature to the region having higher temperature. By this means, when manufacturing the LTPS film, the starting point and the direction of the recrystallization can be under control, the size of the crystalline grain of the LTPS film is improved and the crystalline grain boundary is reduced. Science, the size of the crystalline grain of the LTPS film is improved, and the LTPS film has a larger electronic mobility than in the existing technology.

Figure 17:
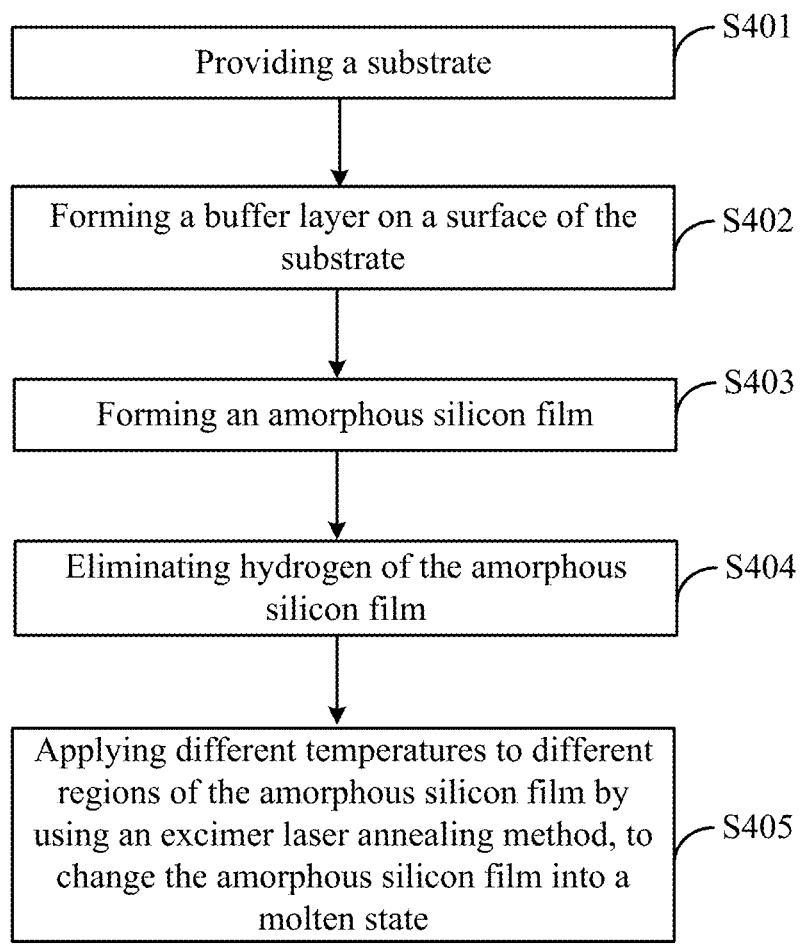
FIG. 17 is a flowchart of a method for manufacturing a low temperature poly-silicon film according to a fourth embodiment of present disclosure.

Referring to FIG. 17, FIG. 17 is a flowchart of a method for manufacturing a low temperature poly-silicon film according to a fourth embodiment of present disclosure. The method for manufacturing a LTPS film in the fourth embodiment is similar with the method for manufacturing a LTPS film in the third embodiment. In the embodiment, the schematic diagrams of section view corresponding to each step of the method in the first embodiment can be referred to.

Step S401, providing a substrate 100. Referring to FIG. 10, the substrate 100 can be a glass substrate in the embodiment. The substrate 100 includes a first surface "a" and a second surface "b" opposite to the first surface "a". It is illustrated that in other embodiment, the substrate 100 is not limited to a glass substrate.

Step S402, forming a buffer layer 110 on a surface of the substrate 100. Referring to FIG. 11, the buffer layer 110 is formed on the first surface "a" in the embodiment. The buffer layer 110 is configured to reduce stress in the processing of manufacturing the LTPS film to avoid a damage of the substrate 100. A material of the buffer layer 110 can be selected from silicon oxide, silicon nitride, silicon oxynitride, and one of a combination of the silicon oxide, the silicon nitride, and the silicon oxynitride.

Step S403, forming an amorphous silicon film 120. Referring to FIG. 12, the step S303 includes the following step in detail. Forming the amorphous silicon film 120 on the buffer layer 110.

Step S404, eliminating hydrogen of the amorphous silicon film 120. The amorphous silicon film 120 is processed in high temperature to eliminate hydrogen of the amorphous silicon film 120 and guarantee a low content (such as, less than 1%) of the hydrogen in the amorphous silicon film 120. In case of the amorphous silicon film 120 is cracked caused by a subsequent step, because high energy generated by the laser in the ELA method may cause a sudden boiling of the hydrogen in the subsequent step.

Step S405, applying different temperatures to different regions of the amorphous silicon film 120 by using an excimer laser annealing method, to change the amorphous silicon film 120 into a molten state. Different regions of the amorphous silicon film 120 are applied by different temperatures by using an excimer laser annealing method, when the amorphous silicon film 120 is changed into the molten state, different regions of the amorphous silicon film 120 have different temperatures. A temperature of a region in a molten state of the amorphous silicon film 120 applied by a higher temperature is higher than a temperature of a region in a molten state of the amorphous silicon film 120 applicted by a lower temperature.

In an embodiment, the step S405 "applying different temperatures to different regions of the amorphous silicon film 120 by using an excimer laser annealing method, to change the amorphous silicon film 120 into a molten state" detailed includes the following step. Irradiating different regions of the amorphous silicon film 120 with laser beams having different energy in order to apply different temperatures to different regions of the amorphous silicon film 120, to change the amorphous silicon film 120 into a molten state.

Referring to FIG. 13 the step S405 "applying different temperatures to different regions of the amorphous silicon film 120 by using an excimer laser annealing method, to change the amorphous silicon film 120 into a molten state" is described in detail as follows. The amorphous silicon film 120 includes a plurality of first regions 121 and a plurality of second regions 122 arranged at intervals; each first region is applied with a first temperature and each second region is applied with a second temperature, to change the amorphous silicon film 120 into a molten state. In the embodiment, the first temperature is higher than the second temperature. Thus, when the amorphous silicon film 120 in a molten state recrystallizes, a direction of recrystallization begins from each second region 122 to each first region 121. When the amorphous silicon film 120 in a molten state recrystallizes, a direction of the recrystallization is from a low energy to a high energy, a low temperature to a high temperature. Thus, as shown in FIG. 14, when the amorphous silicon film 120 in a molten state recrystallizes, each second region 122 serves as a starting point of recrystallization, each first region 121 serves as an end point of recystallization, and the direction of the recrystallization is from each second region 122 to each first region 121. It is illustrated that in other embodiment, the first temperature is lower than the second temperature. In the condication, when the amorphous silicon film 120 in a molten state recrystallizes, each first region 121 serves as a starting point of recrystallization, each second region 122 serves as an end point of recystallization, and the direction of the re recrystallization is from each first region 121 to each second region 122. In the embodiment, a number of the first region 121 is one, and a number of the second region 122 is two. It is illustrated the number of the first region 121 is not limited to one, and the number of the second region 122 is not limited to two.

Referring to FIG. 15 and FIG. 16, FIG. 15s a detailed flowchart of the step of "the amorphous silicon film 120 includes a plurality of a first regions and a plurality of a second regions arranged at intervals; each first region is applied with a first temperature and each second region is applied with a second temperature, to change the amorphous silicon film 120 into a molten state". The detailed flowchart of the step is described as follows.

Step S4031, providing a laser apparatus 200, the laser apparatus 200 being configured to generate laser beams. In detail, the laser apparatus 200 includes a laser head 210, the laser beams generated by the laser apparatus 200 are output by the laser head 210. The laser beams have high energy, and the high energy of the laser beams can change the amorphous silicon film 120 into the molten state.

Step S4032, providing a first polarizing apparatus 300, and generating a first polarized light when the laser beams passing through the first polarizing apparatus 300. The laser head 210 has a light outputting surface 211, and preferably, the first polarizing apparatus 300 is arranged on the lighting outputting surface 211 of the laser head 210. The laser beams are output through the light outputting surface 211, and the first polarized light is generated after the laser beams passing through the first polarizing apparatus 300.

Step S4033, providing a photo mask 400, wherein the photo mask 400 includes a plurality of first light transmission regions 410 and a plurality of second light transmission regions 420 arranged at intervals, arranging a second polarizing apparatus 500 on each second transmission region 420, generating a second polarized light when the first polarized light is passed though the second polarizing apparatus 500, wherein a polarization direction of the second polarized light is different from a polarization direction of the first polarized light, applying the first temperature on each first region 121 when the first polarized light irradiates the first region 121 through the first light transmission region 410, applying the second temperature on each second region 122 when the second polarized light irradiates the second region 122 through the second light transmission region 420. In the embodiment, the second polarizing apparatus 500 is arranged on a surface of the second light transmission region 420, and the surface of the second light transmission region 420 is adjacent to the amorphous silicon film 120. In other words, the second polarizing apparatus 500 is arranged on a surface of the second light transmission region 420, and the surface of the second light transmission region 420 is away from the laser apparatus 200.

In the embodiment, the first polarizing apparatus 300 is a polarizer, and the second polarizing apparatus 500 is also a polarizer. The polarizer is made of Iceland spar, a main component of the Iceland spar is CaCO3, thus, the polarizer is able to tolerate high temperature (such as, more than 1000° C.) and can not be burned out by the laser apparatus 200. An included angle between the polarization direction of the second polarized light and the polarization direction of the first polarized light is greater than zero degree and less than ninety degree. The greater the included angle between the polarization direction of the second polarized light and the polarization direction of the first polarized light is, the weaker the light intensity of the second polarized light is. Thus, when the second polarized light shines on the second region 122 through the second light transmission region 420, the second temperature applied on the second region 122 is much lower than the first temperature applied on the first region 121. In other words, the second temperature is lower than the first temperature, and a difference value between the first temperature and the second temperature is larger. By this means, when the amorphous silicon film 120 crystallizes, a starting point which is from the second region 122 to the first region 121 is orderly, and a size of the crystalline grain is large.

Compared with the existing technology, the embodiment in present disclosure, the different regions of the amorphous silicon film 120 are applied with different temperatures by using the excimer laser annealing method. Thus, when the amorphous silicon film 120 in the molten state crystallizes, the region having a lower temperature serves as the starting point, and the direction of recrystallization begins from the region having lower temperature to the region having higher temperature. By this means, when manufacturing the LTPS film, the starting point and the direction of the recrystallization can be under control, the size of the crystalline grain of the LTPS film is improved and the crystalline grain boundary is reduced. Science, the size of the crystalline grain of the LTPS film is improved, and the LTPS film has a larger electronic mobility than in the existing technology.

An apparatus for manufacturing a LTPS film is also provided in the embodiment. Referring to FIG. 7, the apparatus for manufacturing a LTPS film include a laser apparatus 200, a first polarizing apparatus 300, a photo mask 400, and a second polarizing apparatus 500. The laser apparatus 200 is configured to generate laser beams, and a first polarized light is generated when the laser beams passing through the first polarizing apparatus 300. The photo mask 400 includes a plurality of first light transmission regions 410 and a plurality of second light transmission regions 420 arranged at intervals. A second polarizing apparatus 500 is arranged on each second transmission region 420, and a second polarized light is generated when the first polarized light passes through the second polarizing apparatus 500. The second polarizing apparatus 500 is arranged on a surface of the second light transmission region 420, and the surface of the second light transmission region 420 is away from the laser apparatus 200. A polarization direction of the second polarized light is different from a polarization direction of the first polarized light. The second polarized light and the first polarized light are configured to change the amorphous silicon film into a molten state, and apply different temperatures on different regions of the amorphous silicon film.

An included angle between the polarization direction of the second polarized light and the polarization direction of the first polarized light is greater than zero degree and less than ninety degree. In the embodiment, the first polarizing apparatus 300 is a polarizer, and the second polarizing apparatus 500 is also a polarizer.

A LTPS film is also provided in present disclosure. The LTPS film 120 is formed by a process of changing an amorphous silicon film 120 into a molten state, and recrystallizating. The amorphous silicon film 120 includes a plurality of first regions 121 and a plurality of second regions 122 arranged at intervals. When the amorphous silicon film 120 in a molten state recrystallizes, a direction of recrystallization begins from each second region 122 to each first region 121. A size of the crystalline grain of the LTPS film is greater than 0.8 um. An electronic mobility of the LTPS film is greater than 150 $cm^2/(V*S)$. A temperature of the second region 122 is lower than a temperature of the first region 121.

Combined with the existing technology, the amorphous silicon film 120 is changed into the molten state by using the excimer laser annealing method in the embodiment in present disclosure. When the amorphous silicon film 120 in the molten state crystallizes, the second region 122 having a lower temperature serves as the starting point, and the direction of recrystallization begins from the second region 122 to the first region 121 having a higher temperature. By this means, when manufacturing the LTPS film, the starting point and the direction of the recrystallization can be under control, the size of the crystalline grain of the LTPS film is improved and the crystalline grain boundary is reduced. Science, the size of the crystalline grain of the LTPS film is improved, and the LTPS film has a larger electronic mobility than in the existing technology.

The foregoing descriptions are merely exemplary embodiments of the present invention, but not intended to limit the protection scope of the present disclosure. Any variation or replacement made by persons of ordinary skills in the art without departing from the spirit of the present disclosure shall fall within the protection scope of the present disclosure. Therefore, the scope of the present disclosure shall be subject to be appended claims.

What is claimed is:

1. A method for manufacturing low temperature polysilicon film, comprising:
   providing a substrate;
   forming an amorphous silicon film;
   applying different temperatures to different regions of the amorphous silicon film by using an excimer laser annealing method, to change the amorphous silicon film into a molten state; and
   recrystallizating the amorphous silicon film in the molten state, a region having a lower temperature serving as a starting point, a region having a higher temperature serving as an end point, to form a low temperature poly-silicon film;

wherein the step of "applying different temperatures to different regions of the amorphous silicon film by using an excimer laser annealing method, to change the amorphous silicon film into a molten state" comprises:

the amorphous silicon film comprises a plurality of first regions and a plurality of second regions arranged at intervals, each first region is applied with a first temperature and each second region is applied with a second temperature, to change the first regions and the second regions of the amorphous silicon film into a molten state; and further comprising the following steps:

providing a laser apparatus having a single laser source, the laser source being configured to generate a laser beam;

providing a first polarizing apparatus and generating a first polarized light when the laser beam passes through the first polarizing apparatus; and providing a photo mask, wherein the photo mask comprises a plurality of first light transmission regions and a plurality of second light transmission regions arranged at intervals, wherein first parts of the first polarized light transmit through the first light transmission regions and second parts of the first polarized light first transmit through the second light transmission regions and then transmit through a second polarizing apparatus on each of the second transmission regions to be converted into a second polarized light by the second polarizing apparatus, wherein a polarization direction of the second polarized light is different from a polarization direction of the first polarized light, such that the first temperature is applied on each of the first regions when the first parts of the first polarized light that is formed by allowing the laser beam to transmit through the first polarizing apparatus irradiate the first regions through the first light transmission regions; and the second temperature is applied on each of the second regions when the second polarized light that is formed by allowing the first polarized light that is generated by allowing the laser beam to transmit through the first polarizing apparatus to subsequently transmit through the second polarizing apparatus and the second light transmission regions irradiates the second regions.

2. The method for manufacturing low temperature poly-silicon film according to claim 1, wherein the step of "applying different temperatures to different regions of the amorphous silicon film by using an excimer laser annealing method, to change the amorphous silicon film into a molten state" comprises:

irradiating different regions of the amorphous silicon film with laser beams having different energy in order to apply different temperatures to different regions of the amorphous silicon film, to change the amorphous silicon film into a molten state.

3. The method for manufacturing low temperature poly-silicon film according to claim 1, wherein the first temperature is higher than the second temperature, when the amorphous silicon film in a molten state recrystallizes, and a direction of recrystallization begins from each second region to each first region.

4. The method for manufacturing low temperature poly-silicon film according to claim 1, wherein an included angle between the polarization direction of the second polarized light and the polarization direction of the first polarized light is greater than zero degree and less than ninety degree.

5. The method for manufacturing low temperature poly-silicon film according to claim 1, wherein the first polarizing apparatus is a polarizer and the second polarizing apparatus is a polarizer.

6. The method for manufacturing low temperature poly-silicon film according to claim 1, wherein between the step of "forming an amorphous silicon film" and the step of "applying different temperatures to different regions of the amorphous silicon film by using an excimer laser annealing method, to change the amorphous silicon film into a molten state", the method for manufacturing low temperature poly-silicon film further comprises:

eliminating hydrogen of the amorphous silicon film.

7. The method for manufacturing low temperature poly-silicon film according to claim 1, wherein between the step of "providing a substrate" and the step of "forming an amorphous silicon film", the method for manufacturing low temperature poly-silicon film further comprises:

forming a buffer layer on a surface of the substrate;

the step of "forming an amorphous silicon film" is forming the an amorphous silicon film on the buffer layer.

* * * * *